US009041652B2

(12) United States Patent
Elias et al.

(10) Patent No.: US 9,041,652 B2
(45) Date of Patent: May 26, 2015

(54) FUSION KEYBOARD

(75) Inventors: John Greer Elias, Townsend, DE (US); Steven J. Martisauskas, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 828 days.

(21) Appl. No.: 13/232,955

(22) Filed: Sep. 14, 2011

(65) Prior Publication Data

US 2013/0063286 A1 Mar. 14, 2013

(51) Int. Cl.
*G06F 3/02* (2006.01)
*G06F 3/044* (2006.01)
*H03K 17/96* (2006.01)
*H03K 17/98* (2006.01)
*H01H 13/66* (2006.01)

(52) U.S. Cl.
CPC .............. *G06F 3/0202* (2013.01); *G06F 3/044* (2013.01); *H03K 17/9622* (2013.01); *H03K 17/98* (2013.01); *H03K 2217/96054* (2013.01); *H01H 13/66* (2013.01); *H01H 2225/002* (2013.01); *H01H 2225/03* (2013.01); *H01H 2239/02* (2013.01); *H01H 2239/074* (2013.01)

(58) Field of Classification Search
CPC ............. H04M 2250/22; G06F 1/1626; G06F 3/0202; G06F 3/044; H03K 17/9622; H03K 17/98; H01H 13/66
USPC ........ 341/22, 33, 34; 345/173, 174, 168, 169, 345/172; 455/556.1
See application file for complete search history.

(56) References Cited

U.S. PATENT DOCUMENTS

| | | | |
|---|---|---|---|
| 4,188,136 | A | 2/1980 | Bedocs |
| 4,417,294 | A | 11/1983 | Herron, Jr. |
| 5,189,403 | A | 2/1993 | Franz et al. |
| 5,269,004 | A | 12/1993 | Comerford et al. |

(Continued)

FOREIGN PATENT DOCUMENTS

| | | |
|---|---|---|
| EP | 1 653 338 A1 | 5/2006 |
| JP | 2000-163031 A | 6/2000 |

(Continued)

OTHER PUBLICATIONS

Non-Final Office Action mailed Mar. 10, 2014, for U.S. Appl. No. 13/232,968, filed Sep. 14, 2011, 24 pages.

(Continued)

*Primary Examiner* — Thomas Mullen
(74) *Attorney, Agent, or Firm* — Morrison & Foerster LLP

(57) ABSTRACT

Touch sensitive mechanical keyboards for detecting touch events and key depressions on the keyboard are provided. The keyboard can include a set of individually depressible mechanical keys having a touch sensitive area located on their surface. A touch sensor can be included to detect touch events on the surface of the keys. A keypad can also be included to detect a depression of the mechanical keys. One or more of the depressible mechanical keys can be multi-purpose keys capable of being depressed to multiple levels. The touch sensitive mechanical keyboard can receive key depression input, touch event input, or combinations thereof at the same time. The touch sensitive mechanical keyboard can further include a processor for distinguishing detected touch events from detected key depressions. The processor can generate a key depression command or a touch event command in response to the detected touch events and key depressions.

22 Claims, 11 Drawing Sheets

(56) References Cited

U.S. PATENT DOCUMENTS

| | | | |
|---|---|---|---|
| 5,341,133 A | 8/1994 | Savoy et al. |
| 5,483,261 A | 1/1996 | Yasutake |
| 5,488,204 A | 1/1996 | Mead et al. |
| 5,581,243 A | 12/1996 | Ouellette et al. |
| 5,675,361 A | 10/1997 | Santilli |
| 5,707,160 A | 1/1998 | Bowen |
| 5,736,976 A | 4/1998 | Cheung |
| 5,821,922 A | 10/1998 | Sellers |
| 5,825,352 A | 10/1998 | Bisset et al. |
| 5,835,079 A | 11/1998 | Shieh |
| 5,880,411 A | 3/1999 | Gillespie et al. |
| 5,982,302 A | 11/1999 | Ure |
| 6,188,391 B1 | 2/2001 | Seely et al. |
| 6,204,839 B1 | 3/2001 | Mato, Jr. |
| 6,310,610 B1 | 10/2001 | Beaton et al. |
| 6,323,846 B1 | 11/2001 | Westerman et al. |
| 6,504,530 B1 | 1/2003 | Wilson et al. |
| 6,529,186 B1 | 3/2003 | Thayer |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,428,142 B1 | 9/2008 | Ligtenberg et al. |
| 7,659,887 B2 | 2/2010 | Larsen et al. |
| 7,663,607 B2 | 2/2010 | Hotelling et al. |
| 7,952,038 B1 | 5/2011 | Ando et al. |
| 7,952,566 B2 | 5/2011 | Poupyrev et al. |
| 8,479,122 B2 | 7/2013 | Hotelling et al. |
| 8,581,870 B2 | 11/2013 | Bokma et al. |
| 8,933,905 B2 | 1/2015 | Bokma et al. |
| 2002/0171633 A1 | 11/2002 | Brinjes |
| 2002/0175901 A1 | 11/2002 | Gettemy |
| 2003/0025679 A1 | 2/2003 | Taylor et al. |
| 2003/0201982 A1 | 10/2003 | Lesaka |
| 2004/0183786 A1 | 9/2004 | Jam |
| 2005/0262882 A1 | 12/2005 | Moon |
| 2006/0026521 A1 | 2/2006 | Hotelling et al. |
| 2006/0197753 A1 | 9/2006 | Hotelling |
| 2006/0232557 A1 | 10/2006 | Fallot-Burghardt |
| 2006/0238510 A1 | 10/2006 | Panotopoulos et al. |
| 2007/0063976 A1* | 3/2007 | Oga ............... 345/168 |
| 2007/0120828 A1 | 5/2007 | Fyke |
| 2007/0146334 A1 | 6/2007 | Inokawa |
| 2007/0152975 A1 | 7/2007 | Ogihara et al. |
| 2008/0006453 A1 | 1/2008 | Hotelling |
| 2008/0106519 A1 | 5/2008 | Murray |
| 2008/0158172 A1 | 7/2008 | Hotelling et al. |
| 2008/0158181 A1 | 7/2008 | Hamblin et al. |
| 2008/0202824 A1 | 8/2008 | Philipp et al. |
| 2008/0225006 A1 | 9/2008 | Ennadi |
| 2008/0297475 A1 | 12/2008 | Woolf et al. |
| 2008/0309522 A1 | 12/2008 | Larsen et al. |
| 2009/0000936 A1 | 1/2009 | Steijner |
| 2009/0002199 A1 | 1/2009 | Lainonen et al. |
| 2009/0027347 A1 | 1/2009 | Wakefield et al. |
| 2009/0091536 A1 | 4/2009 | Callaghan |
| 2009/0128503 A1 | 5/2009 | Grant et al. |
| 2009/0160785 A1 | 6/2009 | Chen et al. |
| 2009/0210568 A1 | 8/2009 | Peterson et al. |
| 2009/0314621 A1 | 12/2009 | Hotelling |
| 2010/0053087 A1 | 3/2010 | Dai et al. |
| 2010/0059294 A1 | 3/2010 | Elias et al. |
| 2010/0079309 A1 | 4/2010 | Filson et al. |
| 2010/0123676 A1 | 5/2010 | Kirkup |
| 2010/0148995 A1 | 6/2010 | Elias |
| 2010/0149108 A1 | 6/2010 | Hotelling et al. |
| 2010/0177057 A1 | 7/2010 | Flint et al. |
| 2010/0259482 A1 | 10/2010 | Ball |
| 2010/0271315 A1 | 10/2010 | Bathiche |
| 2010/0273534 A1 | 10/2010 | Strom |
| 2011/0001706 A1 | 1/2011 | Sanford et al. |
| 2011/0141052 A1 | 6/2011 | Bernstein et al. |
| 2011/0163971 A1 | 7/2011 | Wagner et al. |
| 2011/0167375 A1 | 7/2011 | Kocienda |
| 2011/0169765 A1 | 7/2011 | Aono |
| 2011/0193817 A1 | 8/2011 | Byun et al. |
| 2011/0227854 A1 | 9/2011 | Koya |
| 2011/0233041 A1 | 9/2011 | Rajagopal et al. |
| 2011/0241997 A1 | 10/2011 | Yang |
| 2011/0267287 A1 | 11/2011 | Bartling et al. |
| 2012/0256839 A1 | 10/2012 | Suggs |
| 2013/0063285 A1 | 3/2013 | Elias |
| 2013/0063356 A1 | 3/2013 | Martisauskas |
| 2013/0141342 A1 | 6/2013 | Bokma et al. |
| 2014/0035856 A1 | 2/2014 | Bokma et al. |

FOREIGN PATENT DOCUMENTS

| | | |
|---|---|---|
| JP | 2002-342033 A | 11/2002 |
| TW | 201135568 A | 10/2011 |
| TW | 201142685 A | 12/2011 |
| WO | WO-2011/008861 A | 1/2011 |
| WO | WO-2011/018439 A1 | 2/2011 |
| WO | WO-2013/039698 A1 | 3/2013 |
| WO | WO-2013/085580 A1 | 6/2013 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Non-Final Office Action mailed Apr. 27, 2012, for U.S. Appl. No. 12/334,320, filed Dec. 12, 2008, 25 pages.

Final office Action mailed Sep. 17, 2013, for U.S. Appl. No. 12/333,793 filed Dec. 12, 2008, 20 pages.

Non-Final Office Action mailed Aug. 14, 2013, for U.S. Appl. No. 12/334,320, filed Dec. 12, 2008, 37 pages.

Final Office Action mailed Oct. 16, 2012, for U.S. Appl. No. 12/334,320, filed Dec. 12, 2008, 31 pages.

Anonymous. (2008). TouchStream LP User Interface Descriptions, located at http://fingerworks.com/ST_product.html, last visited Nov. 13, 2008, 24 pages total (submitted 14 pages).

Non-Final Office Action mailed Oct. 6, 2011, for U.S. Appl. No. 12/333,793, filed Dec. 12, 2008, 16 pages.

Pash, A. (Nov. 7, 2006). "Hack Attack: Operate Your Mouse with Your Keyboard," *Lifehacker*, located at http://lifehacker.com/software/mouser/hack-attack-operate-your-own-mouse-with-your-keyboard-212816.php, last visited Nov. 10, 2008, seven pages (submitted four pages.).

International Search Report mailed Dec. 19, 2012, for PCT Application No. PCT/US2012/053109, filed Aug. 30, 2012, three pages.

International Search Report mailed Feb. 5, 2013, for PCT Application No. PCT/US2012/052931, filed on Aug. 29, 2012, six pages.

1. Final Office Action mailed Mar. 9, 2012, for U.S. Appl. No. 12/333,793, filed Dec. 12, 2008, 20 pages.

Final Office Action mailed Jun. 4, 2014, for U.S. Appl. No. 14/050,103, filed Oct. 9, 2013, 11 pages.

Non-Final office Action mailed May 22, 2014, for U.S. Appl. No. 12/333,793 filed Dec. 12, 2008, 24 pages.

Non-Final office Action mailed Apr. 15, 2013, for U.S. Appl. No. 12/333,793 filed Dec. 12, 2008, 19 pages.

Non-Final Office Action mailed May 9, 2013, for U.S. Appl. No. 13/232,968, filed Sep. 14, 2011, 21 pages.

Notice of Allowance mailed Jul. 18, 2013, for U.S. Appl. No. 13,312,803, filed Dec. 6, 2011, 8 pages.

Final Office Action mailed Sep. 26, 2013, for U.S. Appl. No. 13/232,968, filed Sep. 14, 2011, 21 pages.

Non-Final Office Action mailed Dec. 13, 2013, for U.S. Appl. No. 14/050,103, filed Oct. 9, 2013, 8 pages.

(56) References Cited

OTHER PUBLICATIONS

Search Report for ROC (Taiwan) Patent Application No. 101134042, mailed Oct. 29, 2013, English Translation, one page.
International Search Report mailed Dec. 5, 2012, for PCT Application No. PCT/US2012/052929, filed Aug. 29, 2012, four pages.
Final Office Action mailed Oct. 2, 2014, for U.S. Appl. No. 13/232,968, filed Sep. 14, 2011, 25 pages.
Final Office Action mailed Nov. 3, 2014, for U.S. Appl. No. 12/333,793, filed Dec. 12, 2008, 24 pages.
Non-Final Office Action mailed Sep. 5, 2014, for U.S. Appl. No. 13/232,941, filed Sep. 14, 2011, 14 pages.
Notice of Allowance mailed Sep. 10, 2014, for U.S. Appl. No. 14/050,103, filed Oct. 9, 2013, seven pages.

* cited by examiner

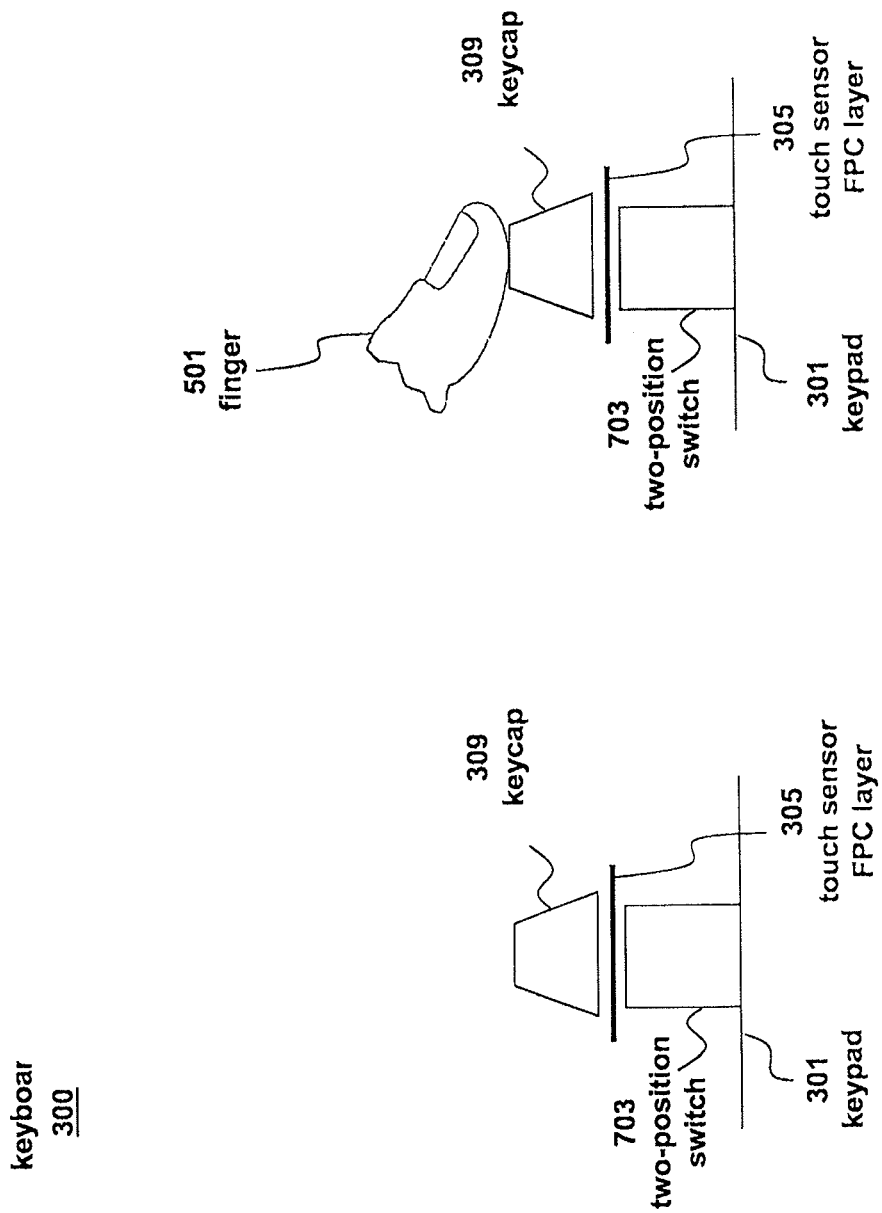

FUSION KEYBOARD

FIELD

This relates generally to input devices and, more specifically, to touch-sensitive input devices.

BACKGROUND

Keyboards are widely used and are generally accepted as the preferred way to provide textual input to a computing system. These keyboards typically have mechanical keys that are arranged in the so-called QWERTY layout and are configured to move independently of one another and comply with standards for key spacing and actuation force.

One of the most common keyboard types is a "dome-switch" keyboard that works as follows. When a key is depressed, the key pushes down on a rubber dome sitting beneath the key. The rubber dome collapses, giving tactile feedback to the user depressing the key, and causes a conductive contact on the underside of the dome to touch a pair of conductive lines on a Printed Circuit Board (PCB) below the dome, thereby closing the switch. A chip in the keyboard emits a scanning signal along the pairs of lines on the PCB to all the keys. When the signal in one pair of the lines changes due to the contact, the chip generates a code corresponding to the key connected to that pair of lines. This code is sent to the computer either through a keyboard cable or over a wireless connection where it is received and decoded into the appropriate key. The computer then decides what to do on the basis of the key depressed, such as display a character on the screen or perform some action. Other types of keyboards operate in a similar manner, with the main differences being how the individual key switches work. Some examples of other keyboards include capacitive-switch keyboards, mechanical-switch keyboards, Hall-effect keyboards, membrane keyboards, roll-up keyboards, and the like.

There have been numerous attempts made to introduce an alternative to the standard keyboard. The changes include, but are not limited to, non-QWERTY layouts, concave and convex surfaces, capacitive keys, split designs, membrane keys, etc. However, while such alternative keyboards may provide improved usability or ergonomics, they have failed to replace or duplicate the commercial success of the conventional mechanical keyboard.

SUMMARY

This relates to touch sensitive mechanical keyboards and processes for detecting touch events and key depressions on the touch sensitive mechanical keyboard. The touch sensitive mechanical keyboard can include a set of individually depressible mechanical keys having a touch sensitive area located on their surface. A touch sensor can be included to detect touch events on the surface of the mechanical keys. A keypad can also be included to detect a depression of the mechanical keys. One or more of the depressible mechanical keys can be multi-purpose keys capable of being depressed to multiple levels. In some embodiments, the touch sensitive mechanical keyboard can receive key depression input, touch event input, or combinations thereof at the same time. The touch sensitive mechanical keyboard can include a processor for distinguishing detected touch events from detected key depressions. The processor can generate either a touch event command or a key depression command in response to the detected touch events and detected key depressions. These will be described in more detail below.

Processes for detecting touch events and key depressions are also disclosed.

BRIEF DESCRIPTION OF THE DRAWINGS

FIG. 7 illustrates a dual-purpose key of a touch sensitive mechanical keyboard according to various embodiments.

FIG. 8 illustrates a user performing a touch event on a surface of a dual-purpose key of a touch sensitive mechanical keyboard according to various embodiments.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to touch sensitive mechanical keyboards and processes for detecting touch events and key depressions on the touch sensitive mechanical keyboard. A touch event, such as a tap or a slide, may be detected when a finger or other object is placed near or in contact with a touch sensitive surface followed by a slide or when a finger or other object is placed near or in contact with the touch sensitive surface followed closely in time with a lift of the finger or object (tap). The touch sensitive mechanical keyboard can include a set of individually depressible mechanical keys having a touch sensitive area located on their surface. A touch sensor can be included to detect touch events on the surface of the mechanical keys. A keypad can also be included to detect a depression of the mechanical keys. One or more of the depressible mechanical keys can be multi-purpose keys capable of being depressed to multiple levels. In some embodiments, the touch sensitive mechanical keyboard can receive key depression input, touch event input, or combinations thereof at the same time. The touch sensitive mechanical keyboard can include a processor for distinguishing detected touch events from detected key depressions. The processor can generate either a touch event command or a key depression command in response to the detected touch events and detected key depressions. These will be described in more detail below. The touch sensitive mechanical keyboard can advantageously allow users to enter textual input using a device having the same look and feel of a conventional keyboard while allowing the users to enter touch events without requiring the users to remove their hands from the keyboard. Moreover, the touch sensitive mechanical keyboard can allow users to enter textual input and/or touch input simultaneously with both hands. Processes for detecting touch events and key depressions are also disclosed.

Although various embodiments describe touch events, it is to be understood that hover events can be detected as well.

Figure 1:
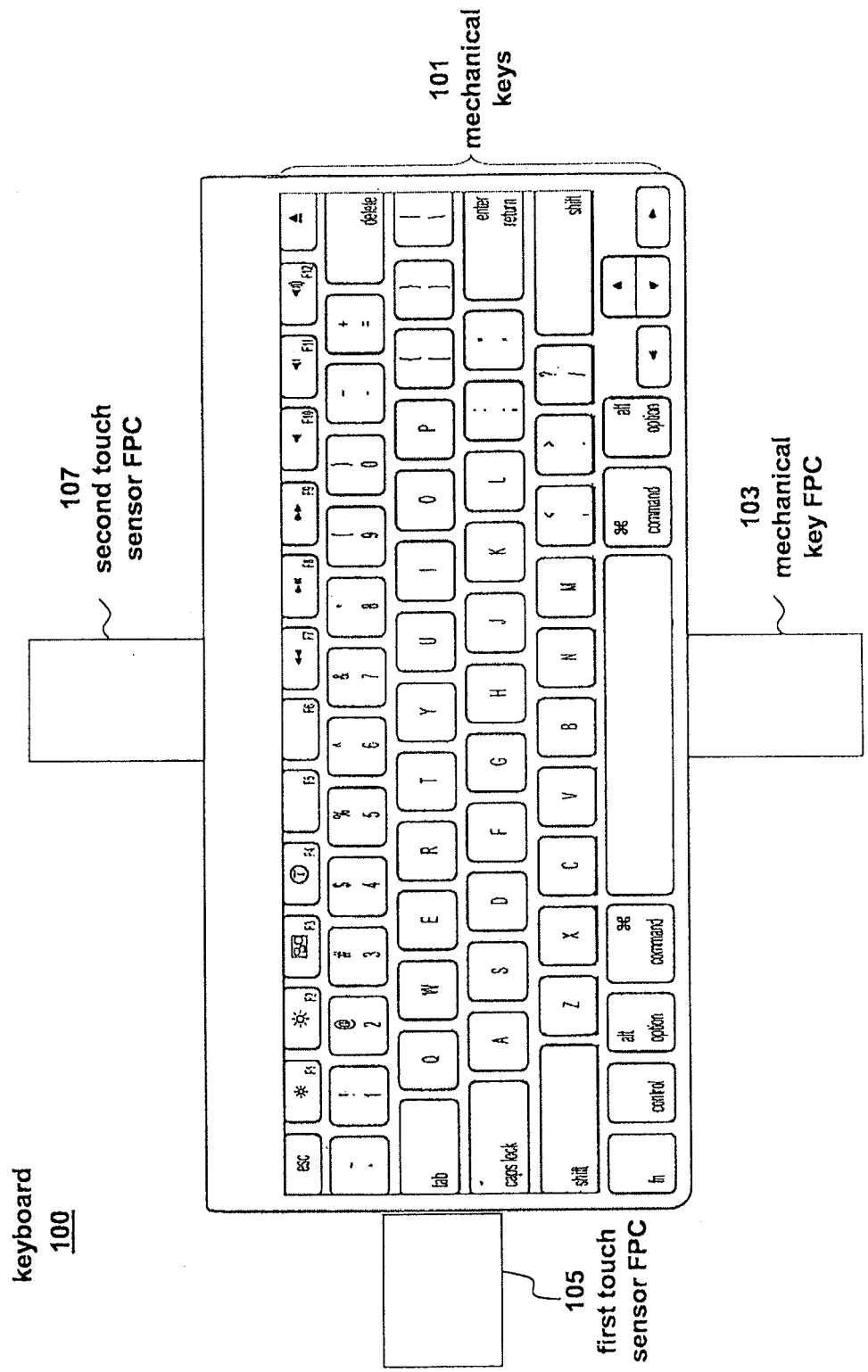
FIG. 1 illustrates a top view of an exemplary touch sensitive mechanical keyboard according to various embodiments.

FIG. 1 illustrates an exemplary touch sensitive mechanical keyboard 100 having mechanical keys 101 and a touch sensitive area located on the surfaces of mechanical keys 101. In some embodiments, keyboard 100 can be configured to have the look and feel of a conventional keyboard. For instance, each mechanical key 101 can be individually depressible, giving the user of keyboard 100 tactile feedback associated with each depression of a key.

Mechanical keys 101 can be used for text entry in a manner similar to a conventional keyboard. Additionally, as will be described in greater detail below, one or more mechanical keys 101 can be multi-purpose keys, such as dual-purpose keys, capable of being depressed to two or more different levels, or depths. As a result, the dual-purpose mechanical keys 101 can be used to generate two or more different outputs depending on the depth of the key depression. Furthermore, the touch sensitive area of keyboard 100 can be used to detect touch events, such as taps or slides, on the surface of mechanical keys 101. In this way, keyboard 100 can also be used for cursor input functions, such as point, click, scroll, drag, select, zoom, and the like, without requiring the user to remove their hands from keyboard 100. These functions, and more, can be driven by hand/finger motion while the fingers are sliding over and touching mechanical keys 101. Moreover, the input of each of the user's hands, whether by key depressions or touch events, can be processed independently. This allows the user to input textual data via key depressions or cursor input functions via touch events with one hand, while the other hand can separately and simultaneously input textual data via key depressions or cursor input functions via touch events.

In some embodiments, the touch sensitive area of keyboard 100 can include the surfaces of all mechanical keys 101. In other embodiments, the touch sensitive area can include the surfaces of only a portion of mechanical keys 101. By integrating multi-touch input capability into keyboard 100 without altering its overall appearance or, more importantly, the familiar way in which it is used for typing, many of the benefits of multi-touch gesture-based input capability can be realized without having a negative impact on the user's text entry experience.

In some embodiments, keyboard 100 can further include mechanical key flexible printed circuit (FPC) 103, first touch sensor FPC 105, and second touch sensor FPC 107 for coupling keyboard 100 to a processor or host computer system. For example, mechanical key FPC 103 can be used by keyboard 100 to output information relating to the depression of one or more of mechanical keys 101. Specifically, a signal indicating that one or more mechanical keys 101 have been depressed can be transmitted through mechanical key FPC 103 to a processor. Similarly, first and second touch sensor FPCs 105 and 107 can be used to output or receive information relating to a touch sensor included within keyboard 100. For example, in some embodiments, keyboard 100 can include a capacitive touch sensor having multiple drive lines and multiple sense lines. In these embodiments, one of first touch sensor FPC 105 and second touch sensor FPC 107 can be used to receive stimulation signals for driving the drive lines while the other touch sensor FPC can be used to transmit touch signals received on the sense lines. In other embodiments, two or more of mechanical key FPC 103, first touch sensor FPC 105, and second touch sensor FPC 107 can be combined into a single FPC.

While specific examples of touch sensitive mechanical keyboard 100 are provided above, it should be appreciated that the principals described in the present disclosure can similarly be applied to touch sensitive mechanical keyboards having other features and configurations. For example, keyboards having non-QWERTY configurations and keyboards complying with ISO, ANSI, JIS, or other standards in extended or compact forms may also be used.

Figure 2:
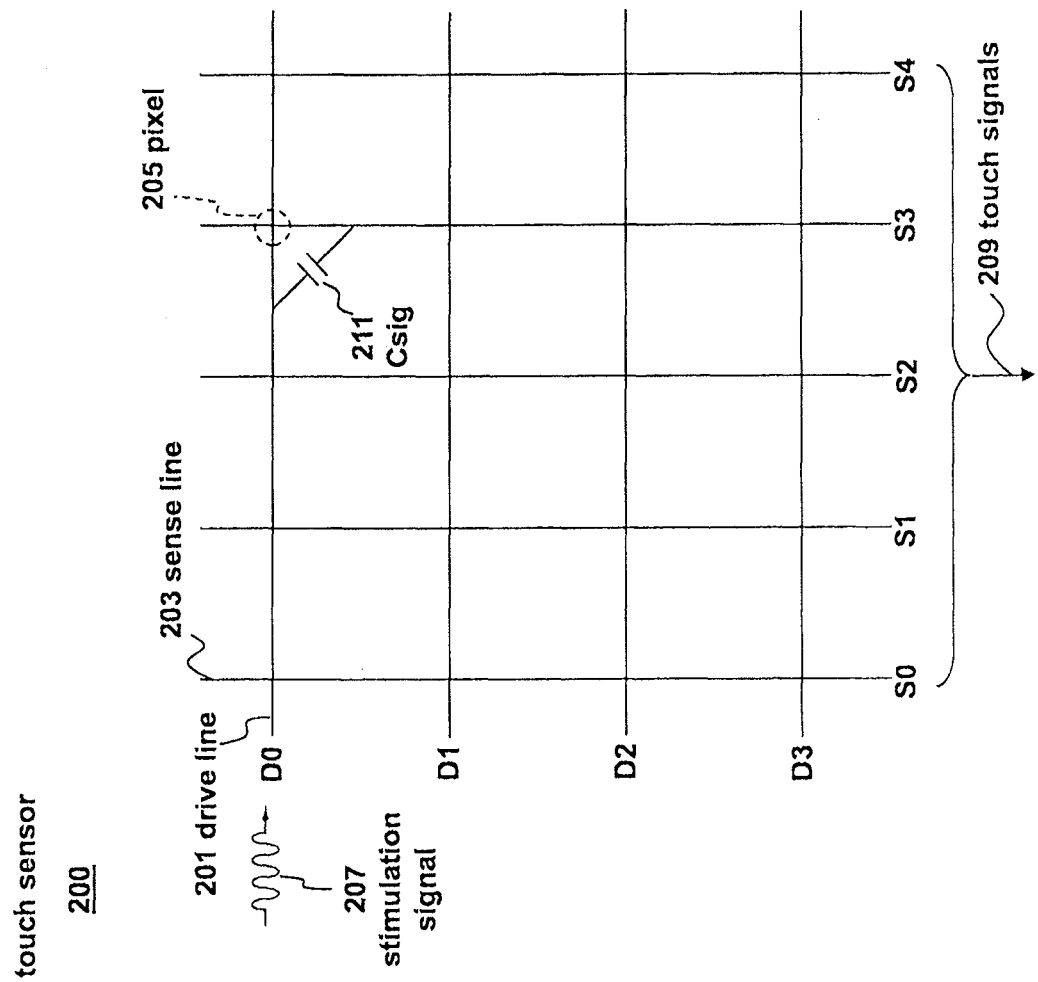
FIG. 2 illustrates an exemplary touch sensor panel that can be used with a touch sensitive mechanical keyboard according to various embodiments.

FIG. 2 illustrates a portion of an exemplary touch sensor 200 that can be used to detect touch events on touch sensitive mechanical keyboard 100. Touch sensor 200 can include an array of pixels 205 that can be formed at the crossing points between rows of drive lines 201 (D0-D3) and columns of sense lines 203 (S0-S4). Each pixel 205 can have an associated mutual capacitance Csig 211 formed between the crossing drive lines 201 and sense lines 203 when the drive lines are stimulated. The drive lines 201 can be stimulated by stimulation signals 207 provided by drive circuitry (not shown) and can include an alternating current (AC) waveform. The sense lines 203 can transmit touch or sense signals 209 indicative of a touch at the panel 200 to sense circuitry (not shown), which can include a sense amplifier for each sense line.

To sense a touch at the touch sensor 200, drive lines 201 can be stimulated by the stimulation signals 207 to capacitively couple with the crossing sense lines 203, thereby forming a capacitive path for coupling charge from the drive lines 201 to the sense lines 203. The crossing sense lines 203 can output touch signals 209, representing the coupled charge or current. When a user's finger (or other object) touches the panel 200, the finger can cause the capacitance Csig 211 to reduce by an amount ΔCsig at the touch location. This capacitance change ΔCsig can be caused by charge or current from the stimulated drive line 201 being shunted through the touching finger to ground rather than being coupled to the crossing sense line 203 at the touch location. The touch signals 209 representative of the capacitance change ΔCsig can be transmitted by the sense lines 203 to the sense circuitry for processing. The touch signals 209 can indicate the pixel where the touch occurred and the amount of touch that occurred at that pixel location. As discussed above, in some embodiments, stimulation signals 207 and touch signals 209 can be received and transmitted via first and second touch sensor FPCs 105 and 107.

While the embodiment shown in FIG. 2 includes four drive lines 201 and five sense lines 203, it should be appreciated that touch sensor 200 can include any number of drive lines 201 and any number of sense lines 203 to form the desired number and pattern of pixels 205. Additionally, while the drive lines 201 and sense lines 203 are shown in FIG. 2 in a crossing configuration, it should be appreciated that other configurations are also possible to form the desired pixel pattern. While FIG. 2 illustrates mutual capacitance touch sensing, other touch sensing technologies may also be used in conjunction with embodiments of the disclosure, such as self-capacitance touch sensing, resistive touch sensing, projection scan touch sensing, and the like. Furthermore, while various embodiments describe a sensed touch, it should be appreciated that the touch sensor 200 can also sense a hovering object and generate hover signals therefrom.

Figure 3:
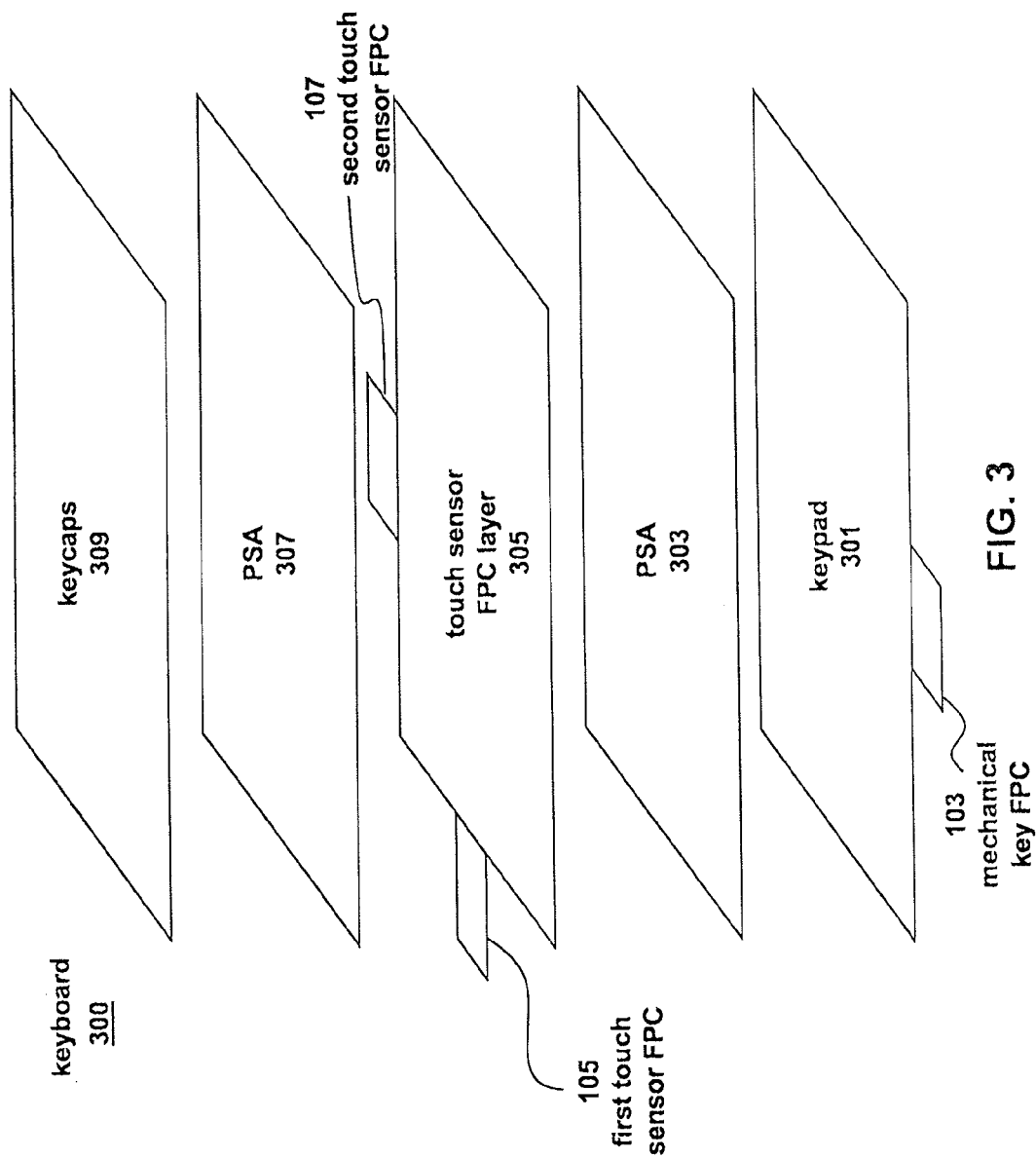
FIG. 3 illustrates an exploded view an exemplary touch sensitive mechanical keyboard according to various embodiments.

FIG. 3 illustrates an exploded view of an exemplary touch sensitive mechanical keyboard 300. Touch sensitive mechanical keyboard 300 is an example of touch sensitive mechanical keyboard 100 and can include a touch sensor similar to touch sensor 200 for detecting touch events on the surface of some or all of the mechanical keys of keyboard 300. Keyboard 300 can include keypad 301 for detecting a depression of one or more of the mechanical keys of keyboard 300. In some embodiments, keypad 301 can include multiple dome-switches that are configured to couple pairs of conductive lines on a PCB below each dome to detect depression of one or more of the mechanical keys. Keyboard 300 can further include a processor (not shown) that emits a scanning signal along the pairs of lines on the PCB to all the keys. When the signal in one pair of the lines changes due to coupling by the dome-switch, the processor can generate a code corresponding to the key connected to that pair of lines. This information can be transmitted through mechanical key FPC 103 to a processor or computing device, such as a laptop computer, desktop computer, mobile device, mobile phone, or the like.

In some embodiments, as discussed in greater detail below with respect to FIGS. 7-10, keyboard 300 can include one or more multi-purpose keys and keypad 301 can include one or more multi-position switches corresponding to each of the one or more multi-purpose keys for detecting a depression of the multi-purpose keys to two or more different levels, or depths, to generate two or more different outputs depending on the depth of the key depression. Alternatively, in other embodiments, a dome-switch and an additional pick-button switch can be used in place of the multi-position switch.

In other embodiments, keypad 301 can detect depression of mechanical keys using other technologies, such as capacitive-switch circuitry, mechanical-switch circuitry, Hall-effect sensors, and the like. It should be appreciated that any known method for detecting depression of mechanical keys can be used.

Keyboard 300 can further include a touch sensor FPC layer 305 containing touch sensor circuitry for detecting touch events on the surface of the mechanical keys. Touch sensor FPC layer 305 can be applied to keypad 301 using an adhesive layer, such as pressure sensitive adhesive (PSA) 303. Touch sensor FPC layer 305 can be located beneath keycaps 309, and can be applied to keycaps 309 using an adhesive layer, such as pressure sensitive adhesive (PSA) 307. Keycaps 309 can include multiple discrete portions forming the front surface of the mechanical keys. The surface of keycaps 309 can include printed or engraved letters, symbols, or numbers. When depressed, the keycaps 309 can directly or indirectly contact the keypad 301 through touch sensor FPC layer 305, causing keypad 301 to detect the depression of the mechanical keys.

In some embodiments, touch sensor FPC layer 305 can include clusters of intersecting drive lines and sense lines forming sensor nodes similar to drive lines 201, sense lines 203, and pixels 205 of touch sensor 200 shown in FIG. 2. Each mechanical key can have associated therewith any number of sensor nodes depending on the desired touch resolution. For example, the drive lines and sense lines can form a grid beneath each keycap 309 to detect touch events along the surface of keycaps 309. To allow the depression of the mechanical keys to be detected by keypad 301, touch sensor FPC layer 305 can be configured to allow a portion of keycaps 309 to directly or indirectly contact keypad 301. For instance, in some embodiments, a plunger located on the bottom of keycaps 309 can be allowed to protrude through touch sensor FPC layer 305. In these embodiments, touch sensor FPC layer 305 can be formed from a stretchable or deformable material to allow independent depression of the keys through FPC layer 305. Alternatively, in other embodiments, FPC layer 305 can be positioned below keypad 301. Since, in these embodiments, key caps 309 can directly or indirectly contact keypad 301 without protruding through FPC layer 305, FPC layer 305 can be formed from non-stretchable or non-deformable materials.

Touch sensor FPC layer 305 can further include first and second touch sensor FPCs 105 and 107 for outputting and receiving signals associated with the operation of touch sensor FPC layer 305. For example, one of first touch sensor FPC 105 and second touch sensor FPC 107 can be used to receive stimulation signals for driving the drive lines of touch sensor FPC layer 305 while the other touch sensor FPC can be used to transmit touch signals received on the sense lines of touch sensor FPC layer 305. These signals can be transmitted to, and received from, a processor or other computing device, such as a laptop computer, desktop computer, and the like. In some embodiments, the processor coupled to touch sensor FPC layer 305 can be the same processor coupled to keypad 301.

As discussed above, keyboards 100 and 300 can be capable of receiving both mechanical key depression input and touch event input. As a result, keyboards 100 and 300 can output two streams of information: a first data stream containing signals representative of a detected depression of one or more mechanical keys via mechanical key FPC 103 and a second data stream containing signals representative of one or more detected touch events via first touch sensor FPC 105 or second touch sensor FPC 107. For example, when a user contacts a surface of a mechanical key, touch sensor FPC layer 305 can report a detected touch event via first touch sensor FPC 105 or second touch sensor FPC 107. When a user depresses a key, touch sensor FPC layer 305 can report a detected touch event via first touch sensor FPC 105 or second touch sensor FPC 107 and keypad 301 can report a detected key depression via mechanical key FPC 103. In some embodiments, when both touch sensor FPC layer 305 reports a detected touch event and keypad 301 reports a detected key depression for the same key, the reported touch event from touch sensor FPC layer 305 can be ignored, resulting in the input being interpreted as a key depression. When both touch sensor FPC layer 305 reports a detected touch event and keypad 301 reports a detected key depression for different keys, both reports can be processed, resulting in both key depression input and touch input being entered. When touch sensor FPC layer 305 reports a detected touch event on two or more different keys or when keypad 301 reports a detected key depression for two or more different keys, each report can be separately processed, resulting in multiple key depression inputs and/or touch event inputs being entered at the same time.

Figure 4:
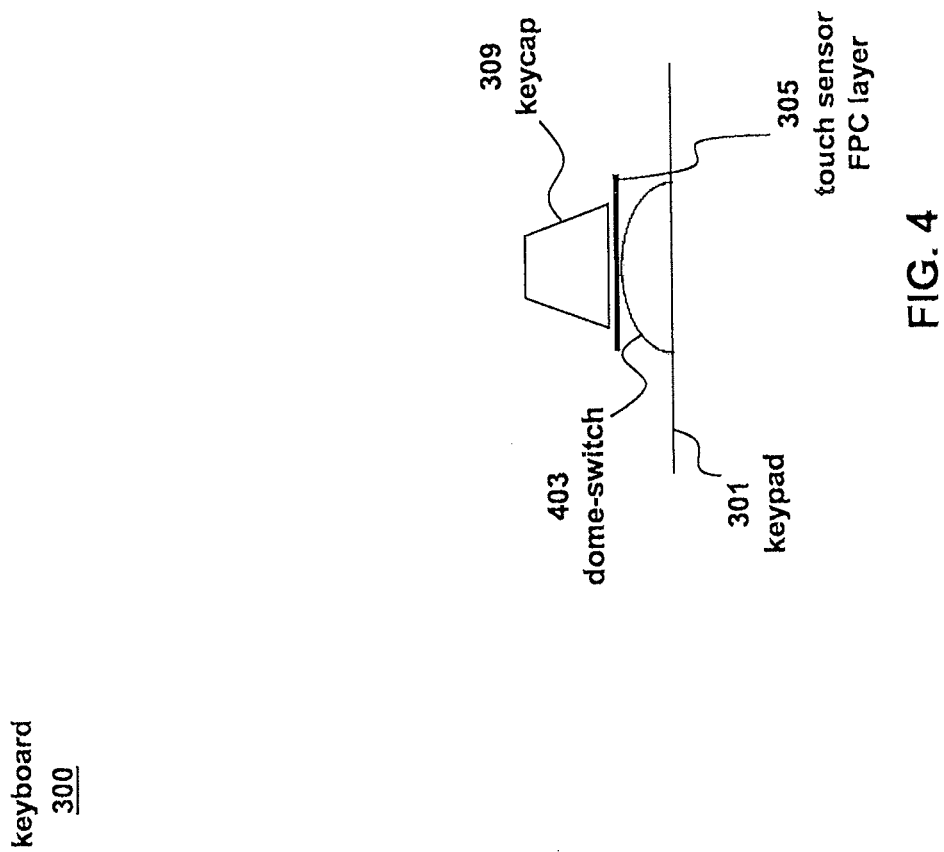
FIG. 4 illustrates a key of a touch sensitive mechanical keyboard according to various embodiments.

FIG. 4 illustrates a cross-sectional view of touch sensitive mechanical keyboard 300. As mentioned above, keyboard 300 can include keypad 301 having one or more dome-switches 403 for detecting a depression of mechanical keys 101. Keyboard 300 can further include touch sensor FPC layer 305 for detecting touch events on the surface of keycaps 309 of mechanical keys 101.

Figure 5:
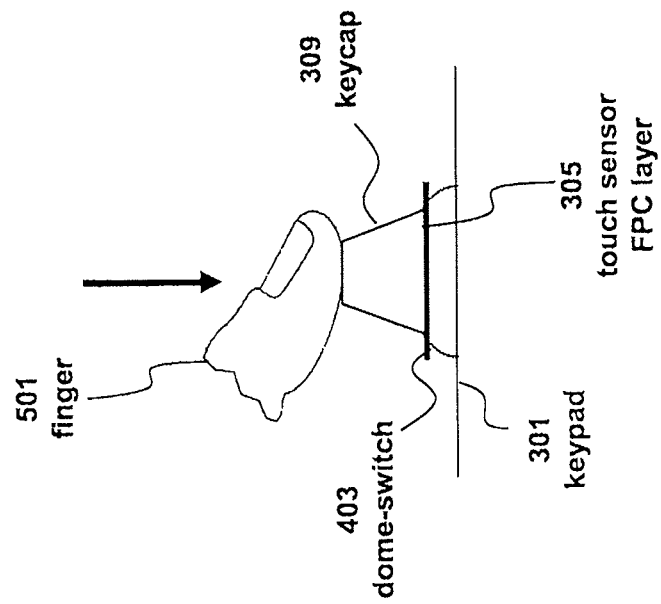
FIG. 5 illustrates a user performing a touch event on a surface of a key of a touch sensitive mechanical keyboard according to various embodiments.

FIG. 5 shows a user inputting a touch event by applying finger 501 to the surface of keycap 309 without exerting sufficient downward force to depress dome-switch 403. This action can cause touch sensor FPC layer 305 to detect the touch event and transmit a signal indicative of a detected touch event via touch sensor FPC 105 or 107. Since the dome-switch 403 is not depressed, keypad 301 may not transmit a signal indicative of a depression of mechanical key 101. Similarly, when a user enters a hover event by placing their finger near the surface of keycap 309, the touch sensor may transmit a signal indicative of a detected hover event via touch sensor FPC 105 or 107. Additionally, since the dome-switch 403 is not depressed, the keypad may not transmit a signal indicative of a depression of mechanical key 101.

Figure 6:
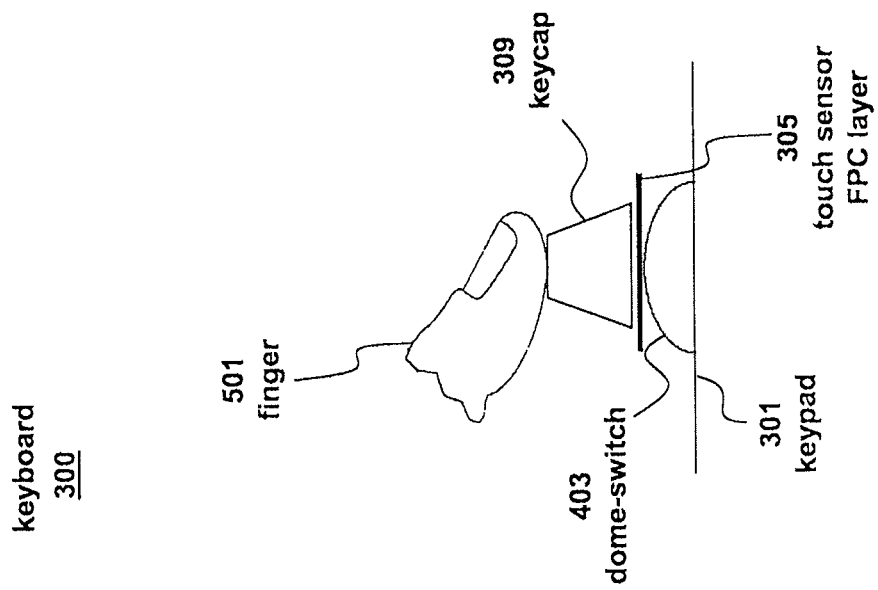
FIG. 6 illustrates a user depressing a key of a touch sensitive mechanical keyboard according to various embodiments.

FIG. 6 shows a user entering a key stroke by applying finger 501 to the surface of keycap 309 and exerting downward force sufficient to depress dome-switch 403. This action can cause keypad 301 to transmit a signal indicative of a depression of mechanical key 101 via mechanical key FPC 103. However, since the user's finger 501 also contacts the surface of keycap 309, touch sensor FPC layer 305 can detect the touch event and transmit a signal indicative of a detected touch event via touch sensor FPC 105 or 107. Thus, in this example, both a touch event signal and a key depression signal can be transmitted from the touch sensitive mechanical keyboard. As mentioned above, in some embodiments, when both a touch event signal and a key depression signal are generated for the same mechanical key 101, the touch event signal can be ignored, resulting in the input being interpreted as a key depression.

FIG. 7 illustrates another cross-sectional view of touch sensitive mechanical keyboard 300. As mentioned above, in some embodiments, keyboard 300 can include one or more multi-purpose keys capable of being depressed to two or more different levels. In the illustrated embodiment, keyboard 300 can include keypad 301 having one or more two-position switches 703 for detecting a depression of dual-purpose mechanical keys 101 to two different levels. Each position, or level, of two-position switch 703 can be interpreted as a different input. For example, depressing a mechanical key 101 to the first level can cause a conventional text input to be generated. Depressing the mechanical key 101 to the second level can cause a different input to be generated, such as a mouse click or text input that is different from that generated at the first level. Keyboard 300 can further include a touch sensor FPC layer 305 for detecting touch events on the surface of keycaps 309 of mechanical keys 101.

In some embodiments, two-position switch 703 can include a membrane switch having multiple detents. The bottom of the membrane switch can include a conductive material configured to close a pair of circuits in response to a depression of the membrane switch. The membrane switch can include a first flexible portion that is configured to be overcome by a first depressive force, thereby allowing the switch to be depressed a first distance to cause the first circuit to be completed. The membrane switch can further include a second flexible portion that is configured to be overcome by a second, larger, depressive force, thereby allowing the switch to be depressed a second, larger, distance to cause the second circuit to be completed. In this way, the membrane switch can be depressed to two different levels while providing the user with tactile feedback associated with each level of depression. While a specific example of two-position switch 703 is provided above, it should be appreciated that two-position switch 703 can include any two-position dome switch, two-position membrane switch, or any other multiple-position switch known to those of ordinary skill in the art.

FIG. 8 shows a user inputting a touch event by applying finger 501 to the surface of keycap 309 without exerting sufficient downward force to depress two-position switch 703. This action can cause the touch sensor FPC layer 305 to detect the touch event and transmit a signal indicative of a detected touch event via touch sensor FPC 105 or 107. Since two-position switch 703 is not depressed, keypad 301 may not transmit a signal indicative of a depression of mechanical key 101. Similarly, when a user enters a hover event by placing their finger near the surface of keycap 309, the touch sensor may transmit a signal indicative of a detected hover event via touch sensor FPC 105 or 107. Additionally, since two-position switch 703 is not depressed, the keypad may not transmit a signal indicative of a depression of mechanical key 101.

Figures 9, 10:
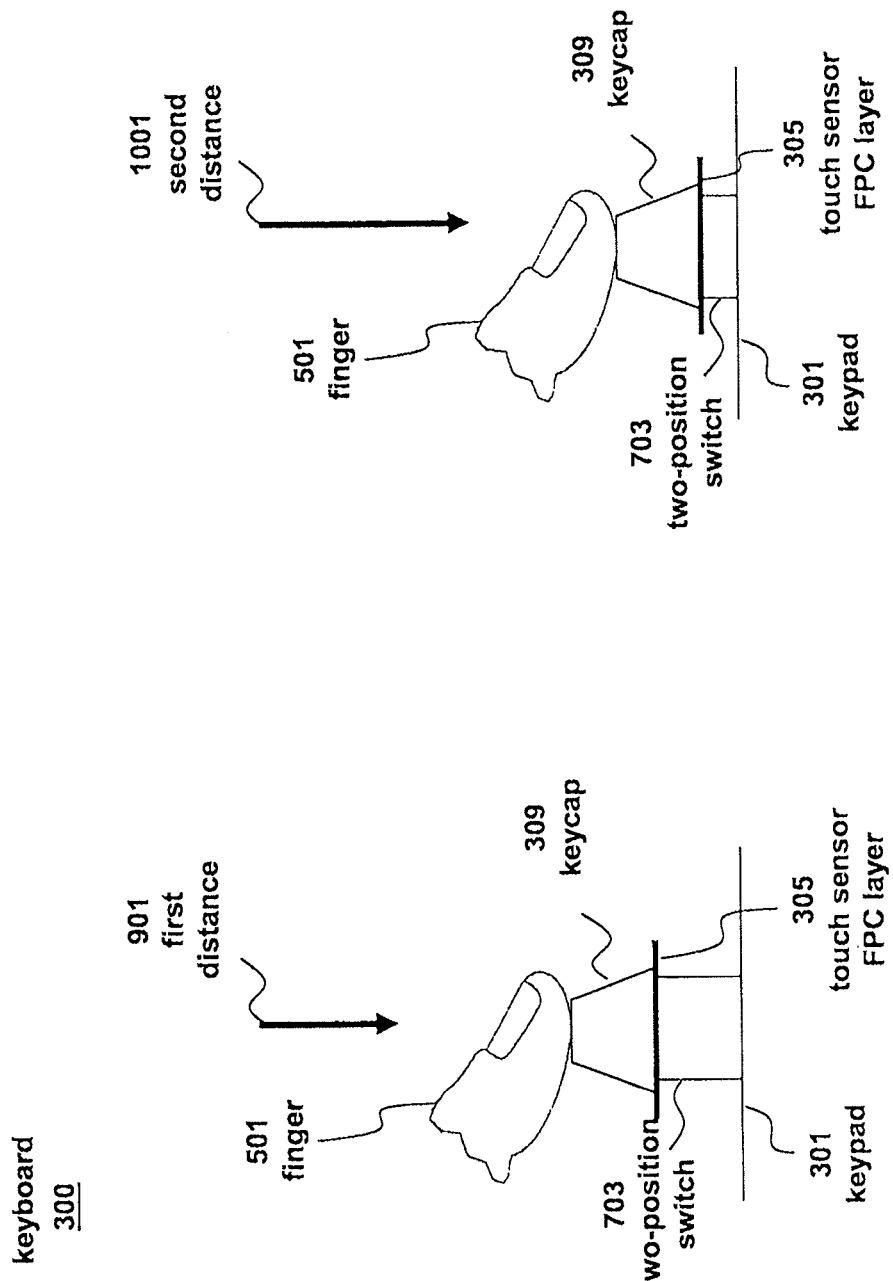
FIG. 9 illustrates a user depressing a dual-purpose key of a touch sensitive mechanical keyboard to a first level according to various embodiments.
FIG. 10 illustrates a user depressing a dual-purpose key of a touch sensitive mechanical keyboard to a second level according to various embodiments.

FIG. 9 shows a user entering a key stroke by applying finger 501 to the surface of keycap 309 and exerting a downward force sufficient to depress two-position switch 703 a first distance 901. This action can cause two-position switch 703 to transmit a first signal indicative of a depression of mechanical key 101 via mechanical key FPC 103. In some embodiments, two-position switch 703 can provide tactile feedback to the user in a manner similar to that of a conventional keyboard indicating that mechanical key 101 has been depressed a distance sufficient to activate the first switch level of two-position switch 703. Since the user's finger 501 also contacts the surface of keycaps 309, the touch sensor FPC layer 305 can detect the touch event and transmit a signal indicative of a detected touch event via touch sensor FPC 105 or 107. Thus, in this example, both a touch event signal and a key depression signal can be transmitted from the touch sensitive mechanical keyboard. As mentioned above, in some embodiments where both a touch event signal and a key depression signal are transmitted for the same mechanical key 101, the touch event signal can be ignored since the user likely intended to enter a key depression input rather than a touch input.

FIG. 10 shows a user entering a key stroke by applying finger 501 to the surface of keycap 309 and exerting a downward force sufficient to depress two-position switch 703 a second distance 1001 that is greater than first distance 901 shown in FIG. 9. This action can cause two-position switch 703 to transmit a second signal indicative of a depression of mechanical key 101 via mechanical key FPC 103. Additionally, similar to the example shown in FIG. 9, since the user's finger 501 also contacts the surface of keycaps 309, the touch sensor FPC layer 305 can detect the touch event and transmit a signal indicative of a detected touch event via touch sensor FPC 105 or 107, resulting in both a touch event signal and a key depression signal being transmitted from the touch sensitive mechanical keyboard. In some embodiments where both a touch event signal and a key depression signal are transmitted for the same mechanical key 101, the touch event signal can be ignored since the user likely intended to enter a key depression input rather than a touch input.

In some embodiments, as discussed above, two-position switch 703 can provide tactile feedback to the user indicating that mechanical key 101 has been depressed a distance sufficient to activate the second switch level of two-position switch 703. The tactile feedback provided to the user in response to reaching the second level of two-position switch 703 can have the same feel or a different feel than the feedback provided in response to reaching the first level of two-position switch 703. For example, in some embodiments, the tactile feedback provided in response to reaching the first level of two-position switch 703 can feel like a key press on a conventional keyboard. In these embodiments, the tactile feedback provided in response to reaching the second level of two-position switch 703 can be stiffer, creating a feeling similar to that provided in response to a mouse click or a depression of a touchpad.

In some embodiments, a processor located in a host computer, in the keyboard assembly, or elsewhere, can be used to determine if a dual-purpose mechanical key has been depressed to a first level or a second level. The processor can be the same processor used to receive the touch event signal and key depression signal described above. Alternatively, the processor can be a different processor than that used to receive the touch event signal and key depression signal described above. For example, in some embodiments, the processor can be coupled to receive touch and key depression signals from the sensors within touch sensitive mechanical keyboard (e.g., keyboard 100 or 300) via a connector (e.g., FPCs 103, 105, and 107).

In some embodiments, upon receipt of a signal indicating that a dual-purpose mechanical key 101 has been depressed to the first level, the processor can wait a threshold length of time for a signal indicating that the dual-purpose mechanical key 101 has been depressed to the second level. This can be done because when a user attempts to depresses a dual-purpose key to the second level, the dual-purpose key may first be depressed to the first level, causing the keypad circuitry to detect a key depression. In response, the keypad circuitry may send a first key depression signal to the processor indicating that a key depression event (the key being depressed to the first level) has been detected. However, since the user is attempting to further depress the dual-purpose key to the second level, the key can be further depressed a short time after the key reaches the first level. This can cause the keypad circuitry to detect the depression of the key and transmit a second key depression signal indicating that a key depression event (the key being depressed to the second level) has been detected. Thus, to prevent the generation of excessive or erroneous signals, the processor may wait a threshold length of time after receiving the first key depression signal to account for the delay between the dual-purpose mechanical key reaching the first level and the second level. The threshold length of time may have a duration that is sufficiently long to allow the user to fully depress the key without causing a noticeable delay between the time the user presses the key and the time a computer system reacts to the input. Thus, if the second key depression signal is received within the threshold length of time, the key depression can be interpreted as a key depression to the second level. If, however, the second key depression signal is not received within the threshold length of time, the key depression can be interpreted as a key depression to the first level.

Figure 11:
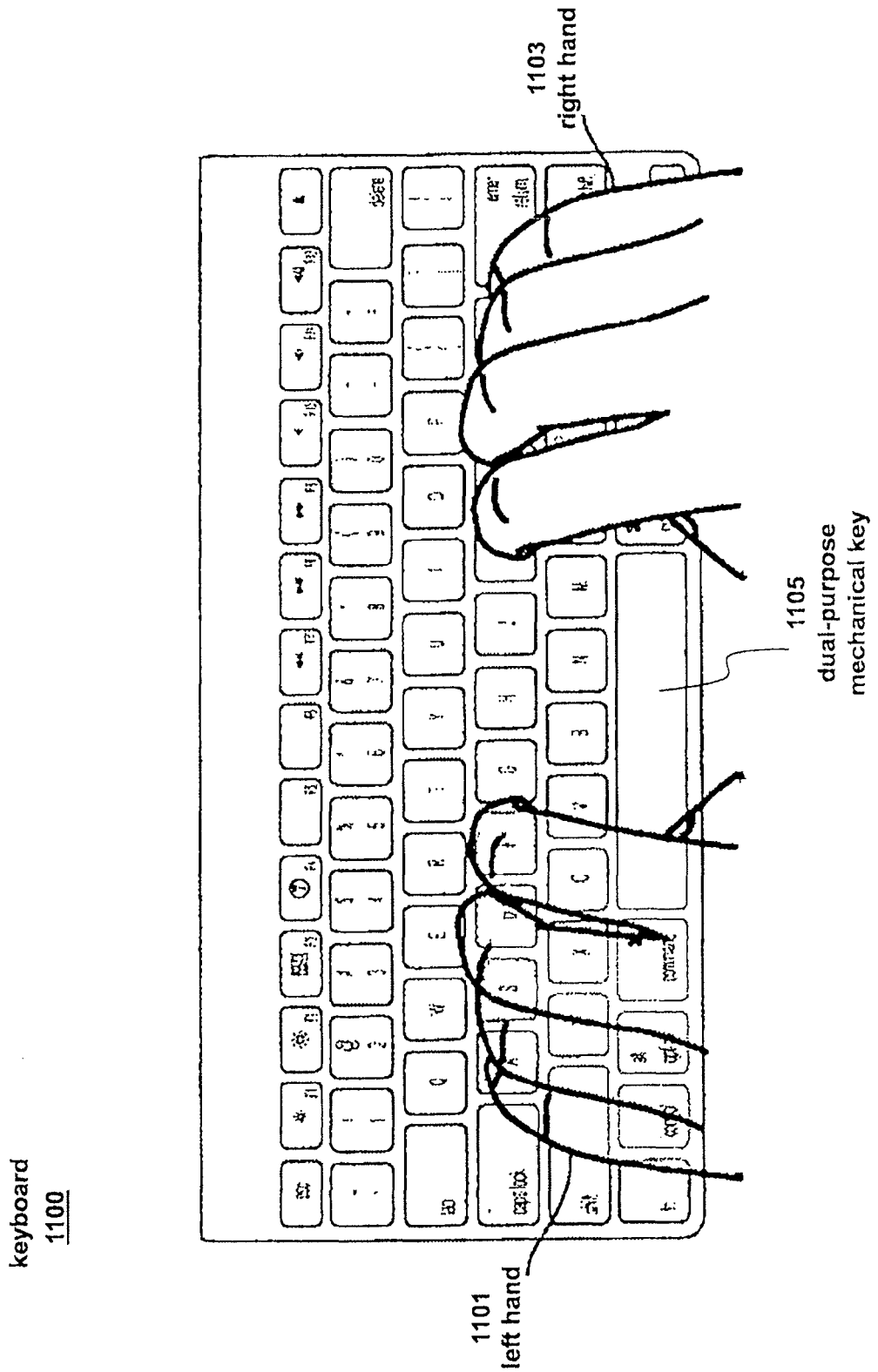
FIG. 11 illustrates a user operating a touch sensitive mechanical keyboard according to various embodiments.

FIG. 11 shows exemplary touch sensitive mechanical keyboard 1100, such as keyboard 100 or 300, being used to enter various types of input. In some embodiments, left hand 1101 can be used to enter textual data, such as characters, numbers, and symbols, by depressing mechanical keys 101, and/or left hand 1101 can be used to perform touch events, such as scrolling, panning, dragging, pointing, zooming, clicking, selecting, and the like. Similarly, right hand 1103 can be used to enter textual data, such as characters, numbers, and symbols, by depressing mechanical keys 101, and/or right hand 1103 can be used to perform touch events, such as scrolling, panning, dragging, pointing, zooming, clicking, selecting, and the like.

In some embodiments, left hand 1101 and right hand 1103 can be used to simultaneously enter textual data or perform touch events. For example, either left hand 1101 or right hand 1103 can be used to perform touch events (e.g., panning, dragging, scrolling, pointing, zooming, clicking, selecting, and the like) while the other hand is used to enter textual data. In other examples, both left hand 1101 and right hand 1103 can be used to enter textual information. In yet other examples, both left hand 1101 and right hand 1103 can be used to perform touch events. Similarly, one hand can be rested on the keyboard (not entering textual data or performing touch events) while the other hand is entering textual data or performing touch events. The input for each hand can be processed separately, resulting in multiple key depression inputs and/or touch event inputs being entered at the same time.

In some embodiments, one or more of the mechanical keys 101 can be dual-purpose mechanical keys 1105 capable of being depressed to two or more different levels, or depths, to generate two or more different outputs depending on the depth of the key depression. In some embodiments, the dual-purpose mechanical key 1105 can be the spacebar and can be configured to generate a space character upon being depressed to the first level and can be configured to generate a mouse click upon being depressed to the second level. However, it should be appreciated that any of the mechanical keys 101 can be dual-purpose keys and that each dual-purpose key can be configured to generate any desired output upon being depressed to the first and second levels. Moreover, it should be appreciated that the dual-purpose functionality of the keys can be configured by a user. For example, the user can select which keys may operate as dual-purpose keys and can select the type of output generated by each level of the dual-purpose keys.

Figure 12:
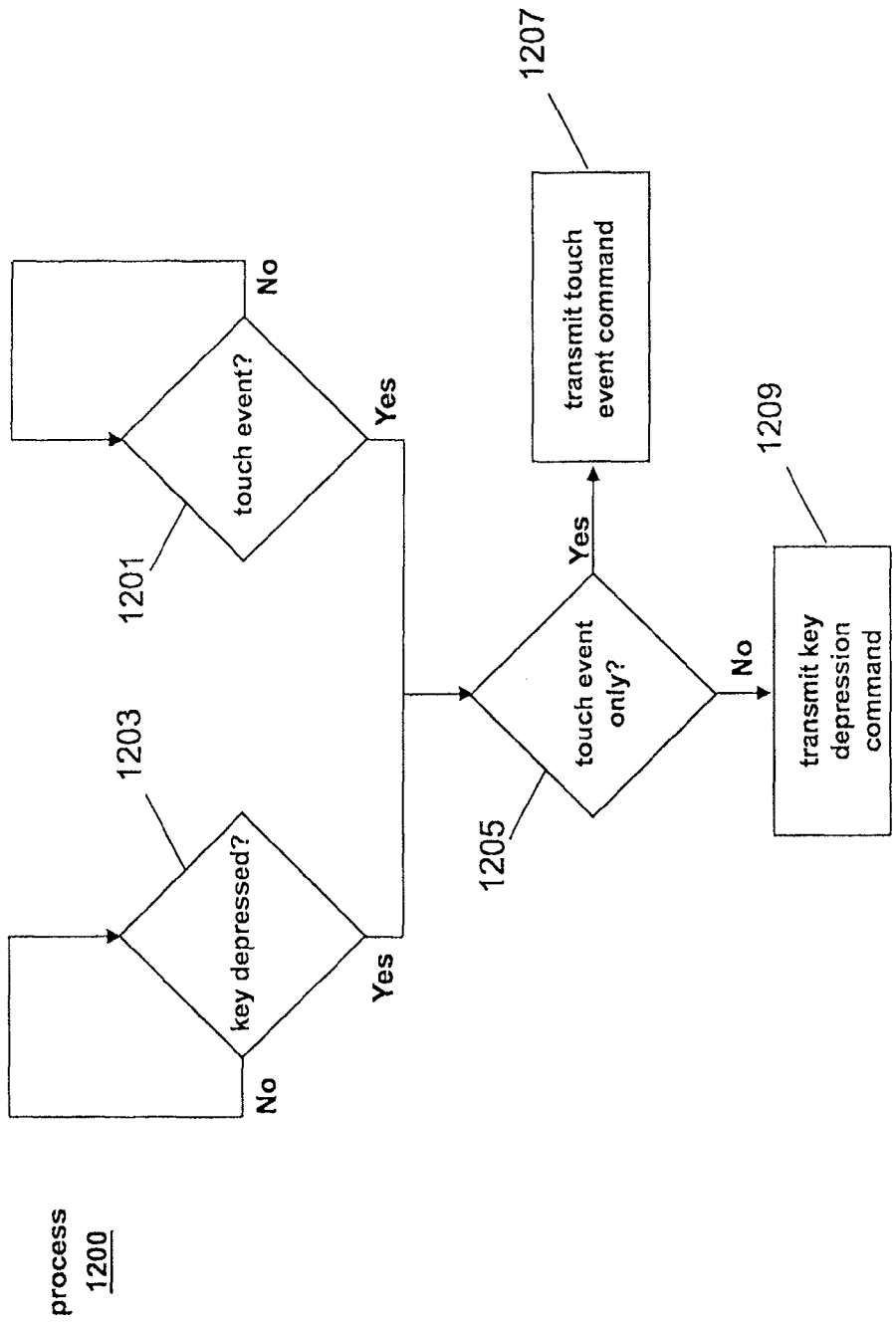
FIG. 12 illustrates an exemplary process for detecting touch events and key depressions of a touch sensitive mechanical keyboard according to various embodiments.

FIG. 12 shows an exemplary process 1200 for detecting touch events and key depressions on a touch sensitive mechanical keyboard similar or identical to touch sensitive mechanical keyboards 100, 300, or 1100. Additionally, process 1200 can provide a way to distinguish between touch events and key depressions on a touch sensitive mechanical keyboard.

At block 1201 of process 1200, the surface of some or all of the mechanical keys of a touch sensitive mechanical keyboard can be monitored for a touch event. In some embodiments, a touch sensor similar or identical to touch sensor 200 or touch sensor FPC layer 305 can be used to detect touch events on or near the surface of mechanical keys 101. If no touch event is detected, the process can repeat back to block 1201 where the surface of some or all of mechanical keys 101 can continue to be monitored. However, if a touch event is detected, the process can proceed to block 1205. In some embodiments, if a touch event is detected, the touch sensor of the touch sensitive mechanical keyboard can transmit a touch event signal indicating that a touch event has occurred as well as information relating to the touch event (e.g., location, duration, motion, or the like). For example, a touch event signal can be transmitted by touch sensor 200 or touch sensor FPC layer 305 to a processor via first or second touch sensor FPC 105 or 107. The processor can be located within the touch sensitive mechanical keyboard or can be located separate from the touch sensitive mechanical keyboard.

Similarly, at block 1203 of process 1200, the mechanical keys of a touch sensitive mechanical keyboard can be monitored for a depression of one or more of the mechanical keys. In some embodiments, a keypad similar or identical to keypad 301 can be used to detect a depression of one or more mechanical keys 101 of keyboard 100, 300, or 1100. If no key depression is detected, the process can repeat back to block 1203 where the mechanical keys 101 can continue to be monitored. However, if a key depression is detected, the process can proceed to block 1205. In some embodiments, if a depression of one or more mechanical keys is detected, the keypad of the touch sensitive mechanical keyboard, such as keyboard 100, 300, or 1100, can transmit a key depression signal indicating that a key depression has occurred as well as information relating to the key depression (e.g., key depressed, duration, or the like). For example, a key depression signal can be transmitted by keypad 301 to a processor via mechanical key FPC 103. In some embodiments, the processor can be the same processor that receives the touch signal from touch sensor 200 or touch sensor FPC layer 305 via first or second touch sensor FPC 105 or 107. In other embodiments, a separate processor can be used.

At block 1205, it can be determined whether only a touch event has been detected or if both a touch event and a key depression have been detected. If a touch event has been detected and no key depression has been detected, the process can proceed to block 1207. However, if both a touch event and key depression have been detected, the process can proceed to block 1209.

In some embodiments, a processor located in a host computer, in the keyboard assembly, or elsewhere, can be used to determine if only a touch event has been detected or if both a touch event and a key depression have been detected. The processor can be the same processor used to receive the touch event signal and key depression signal described above. Alternatively, the processor can be a different processor than that used to receive the touch event signal and key depression signal described above. For example, in some embodiments, the processor can be coupled to receive touch and key depression signals from the sensors within touch sensitive mechanical keyboard (e.g., keyboard 100, 300, or 1100) via a connector (e.g., FPCs 103, 105, and 107).

In some embodiments, upon receipt of a signal indicating a touch event has been detected, the processor can wait a first threshold length of time for a signal indicating a key depression has been detected. This can be done because when a user depresses a key to input a character, number, or symbol, the user's finger can contact the surface of the key, causing the touch sensor circuitry to detect the touch event. The touch sensor circuitry can then send a signal to the processor indicating a touch event has been detected. However, since the user is attempting to enter a keystroke, the key can also be depressed a short time after the user's finger contacts the surface of the key. This can cause the keypad circuitry to detect the depression of the key and transmit a signal indicating that a key depression has been detected. Thus, to prevent the generation of excessive or erroneous signals, the processor may wait a first threshold length of time after receiving the touch event signal to account for the delay between the user touching the key and the key being depressed. The first threshold length of time may have a duration that is sufficiently long to allow the user to fully depress the key without causing a noticeable delay between the time the user presses the key and the time a computer system reacts to the input. Thus, if the key depression signal is received within the first threshold length of time after receiving the touch event signal, the input can be interpreted as a key depression and the process can proceed to block 1209. If, however, the key depression signal is not received within the first threshold length of time after receiving the touch event signal, then the input can be interpreted as a touch event and the process can proceed to block 1207.

It should be appreciated that the determination performed at block 1205 can be done on a per-key basis. For example, if a touch event is detected on a particular key (e.g., the "F" key), it can be determined whether the same key (the "F" key) has been depressed. If the same key has been depressed, the process can proceed to block 1209. If, however, a different key is depressed (e.g., the "R" key), the input can be interpreted as a touch event on the "F" key and the process can proceed to block 1207. For the different depressed key (e.g., the "R" key), the process 1200 can repeat in order to interpret its input and eventually proceed to block 1209. In this way, the touch sensitive mechanical keyboard can detect touch events on one portion of the keyboard while receiving textual input at another portion of the keyboard as described above with respect to FIG. 11. Additionally, for a touch event received on a different key (e.g., the "W" key), the process 1200 can repeat in order to interpret its input and eventually proceed to block 1207. This allows the detection of a touch event on a first key while simultaneously detecting another touch event on a second key. In this way, a user can perform two touch events at the same time. For example, the user can move a pointer arrow with one hand and move a text cursor with the other or the user can scroll with one hand and move a pointer arrow with the other. Other combinations of touch events, such as panning, dragging, scrolling, pointing, zooming, clicking, selecting, and the like can be implemented using one or two hands on the keyboard.

Additionally, as discussed above, one or more mechanical keys can be multi-purpose mechanical keys (e.g., dual-purpose mechanical keys). In some embodiments, a processor located in a host computer, in the keyboard assembly, or elsewhere, can be used to determine if the dual-purpose mechanical key has been depressed to a first level or a second level. In some embodiments, the processor can determine if the dual-purpose mechanical key has been depressed to the first level or the second level by waiting a second threshold length of time after receiving a first key depression signal indicating that a depression of the key to the first level has been detected. If a second key depression signal indicating that a depression of the key to the second level has been detected is received within the second threshold length of time, then the key depression can be interpreted as a second level key depression. If the second key depression signal is not received within the second threshold length of time, the key depression can be interpreted as a first level key depression. In some examples, the second threshold length of time can have any duration that is sufficient to allow the user to fully depress the dual-purpose mechanical key. It should be appreciated that if either the first or second key depression signal is received within the first threshold length of time after receiving the touch event signal, the input can be interpreted as a key depression and the process can proceed to block 1209 where a command corresponding to the detected key depression level can be transmitted.

At block 1207, a touch event command, such as a tap or slide event command, can be transmitted. In some embodiments, a processor can transmit a signal to another processor or host computer indicating that a tap or slide has been received by the touch sensitive mechanical keyboard. In response to the touch event command, the processor or host computer can cause a touch event, such as panning, dragging, scrolling, pointing, zooming, clicking, selecting, or the like to be performed.

At block 1209, a key depression command identifying the depressed key can be transmitted. In some embodiments, a processor can transmit a signal to another processor or host computer indicating that a key depression has been received by the touch sensitive mechanical keyboard. In some embodiments for a dual-purpose mechanical key, the key depression command can include information identifying the detected level of key depression. In these embodiments, a first key depression command indicating that a key depression to the first level has been detected can cause the processor or host computer to generate a conventional character while a second key depression command indicating that a key depression to the second level has been detected can cause the processor or host computer to generate a different input. For example, depressing the spacebar to the first level can cause a space character to be generated while depressing the spacebar to the second level can cause a mouse click operation to be performed. Thus, if the second key depression signal indicating that the key has been depressed to a second level is received within the second threshold length of time, then the processor can determine that the input should be interpreted as the input (e.g., a mouse click) associated with the second level of depression and generate the second key depression command. If, however, the second key depression signal is not received within the second threshold length of time, then the processor can determine that the input should be interpreted as a conventional key input (e.g., character, symbol, or number entry) and generate the first key depression command.

Figure 13:
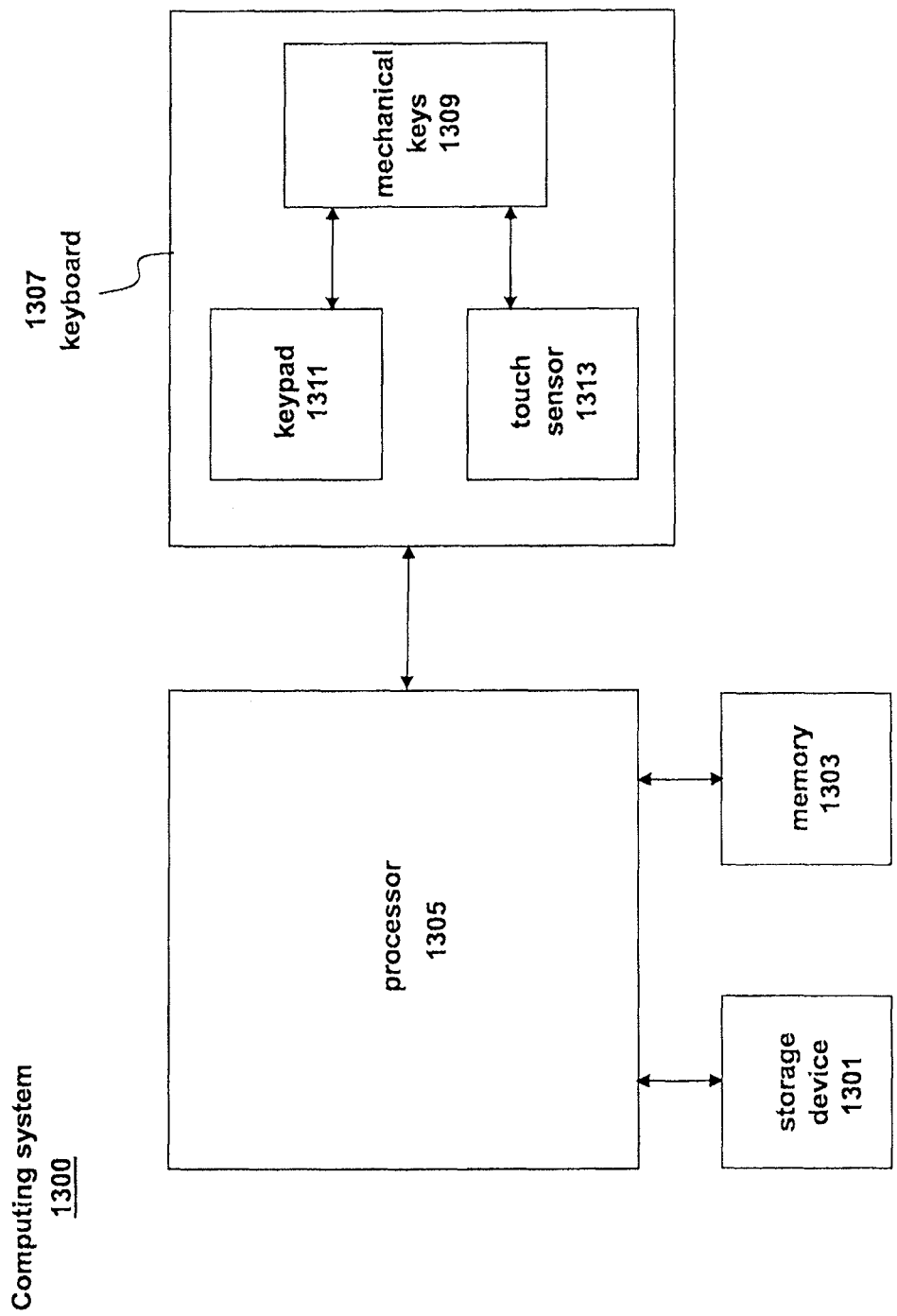
FIG. 13 illustrates an exemplary system including an input device according to various embodiments.

One or more of the functions relating to the detection of a touch event or key depression can be performed by a computing system similar or identical to computing system 1300 shown in FIG. 13. Computing system 1300 can include instructions stored in a non-transitory computer readable storage medium, such as memory 1303 or storage device 1301, and executed by processor 1305. The instructions can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such as a CD, CD-R, CD-RW, DVD, DVD-R, or DVD-RW, or flash memory such as compact flash cards, secured digital cards, USB memory devices, memory sticks, and the like.

The instructions can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Computing system 1300 can further include touch sensitive mechanical keyboard 1307 coupled to processor 1305. Touch sensitive mechanical keyboard 1307 can be similar or identical to touch sensitive mechanical keyboard 100, 300, or 1100 described above. In some embodiments, keyboard 1307 can include mechanical keys 1309, keypad 1311, and touch sensor 1313 for detecting touch events and key depressions and for providing signals indicating a detection of a touch event or key depression to processor 1305. In some embodiments, mechanical keys 1309 can be similar or identical to mechanical keys 101, keypad 1311 can be similar or identical to keypad 301, and touch sensor 1313 can be similar or identical to touch sensor 200 or touch sensor FPC layer 305, described above. Processor 1305 can receive the detection signals from keyboard 1307 and interpret them as touch events or key depressions in a manner similar or identical to that described above with respect to process 1200.

It is to be understood that the computing system is not limited to the components and configuration of FIG. 13, but can include other or additional components in multiple configurations according to various embodiments. Additionally, the components of computing system 1300 can be included within a single device, or can be distributed between two or more devices. For example, while processor 1305 is shown separate from keyboard 1307, in some embodiments, processor 1305 can be located within keyboard 1307.

Figure 14:
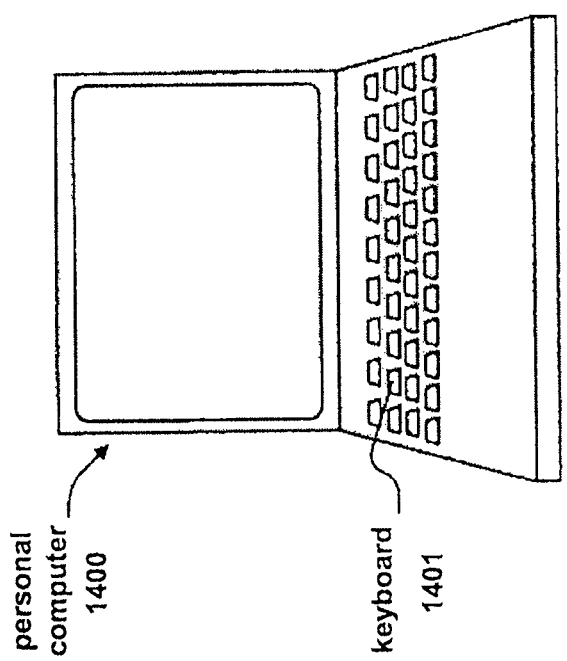
FIG. 14 illustrates an exemplary personal computer including an input device according to various embodiments.

FIG. 14 illustrates an exemplary personal computer 1400 that can include a touch sensitive mechanical keyboard 1401 according to various embodiments.

Figure 15:
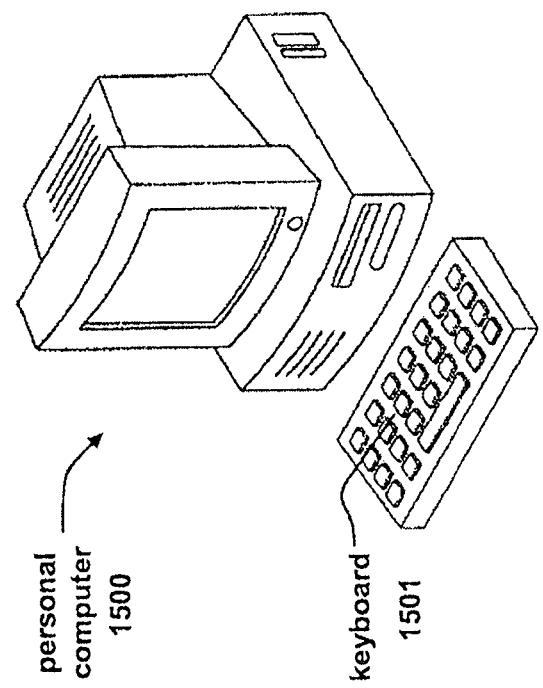
FIG. 15 illustrates another exemplary personal computer including an input device according to various embodiments.

FIG. 15 illustrates another exemplary personal computer 1500 that can include a touch sensitive mechanical keyboard 1501 according to various embodiments.

The personal computers of FIGS. 14 and 15, as well as other computing devices, can receive both touch input and mechanical key input by utilizing a touch sensitive mechanical keyboard according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:
1. A keyboard comprising:
a plurality of depressible keys, wherein at least one key of the plurality of depressible keys is a dual-purpose key configured to be depressed a first distance to a first level and a second distance to a second level;
a plurality of switch sensors configured to detect a depression of a key of the plurality of depressible keys, wherein at least one switch sensor of the plurality of switch sensors is configured to detect the at least one dual-purpose key being depressed the first distance to the first level and the at least one dual-purpose key being depressed the second distance to the second level;
an array of capacitive sensors configured to detect a touch event on a surface of one or more of the plurality of depressible keys; and
a processor configured to:
receive a touch event signal indicating that the touch event has been detected by the array of capacitive sensors on the surface of the one or more of the plurality of depressible keys;
receive a key depression signal indicating that the depression of the key of the plurality of depressible keys has been detected by at least one of the plurality of switch sensors;
generate a key depression command signal in response to receiving the key depression signal; and
generate a touch event command signal in response to a threshold length of time elapsing from receiving the touch event signal without receiving the key depression signal.

2. The keyboard of claim 1, wherein at least a portion of the touch event occurs coextensive in time with the depression of the key of the plurality of depressible keys.

3. The keyboard of claim 1, wherein the key depression signal comprises at least one of a first key depression signal or a second key depression signal, and wherein the processor is further configured to:
receive the first key depression signal indicating that the depression of the first distance to the first level of the at least one dual-purpose key has been detected by the at least one switch sensor; and
receive the second key depression signal indicating that the depression of the second distance to the second level of the at least one dual-purpose key has been detected by the at least one switch sensor.

4. The keyboard of claim 3, wherein the processor is further configured to:
generate a first key depression command signal in response to a threshold length of time elapsing from receiving the first key depression signal without receiving the second key depression signal; and
generate a second key depression command signal in response to receiving the second key depression signal within the threshold length of time from receiving the first key depression command signal.

5. A keyboard comprising:
a plurality of depressible keys;
a plurality of switch sensors configured to detect a depression of a key of the plurality of depressible keys; and
an array of capacitive sensors configured to detect a touch event on a surface of one or more of the plurality of depressible keys, wherein the plurality of switch sensors and the array of capacitive sensors are further configured to:
detect a first input comprising one of a depression of a first key of the plurality of depressible keys or a touch event on a surface of the first key of the plurality of depressible keys; and
detect a second input comprising one of a depression of a second key of the plurality of depressible keys or a touch event on a surface of the second key of the plurality of depressible keys, wherein the first input occurs coextensive in time with the second input; and
a processor configured to generate:
a first command signal in response to the first input; and
a second command signal in response to the second input.

6. The keyboard of claim 5, wherein the first command signal comprises at least one of a first touch event command signal or a first key depression command signal and the second command signal comprises at least one of a second touch event command signal or a second key depression command signal, and wherein the processor is further configured to:
generate the first key depression command signal in response to the first input comprising the depression of the first key of the plurality of depressible keys;
generate the first touch event command signal in response to the first input comprising the touch event on the surface of the first key of the plurality of depressible keys;
generate the second key depression command signal in response to the second input comprising the depression of the second key of the plurality of depressible keys; and
generate the second touch event command signal in response to the second input comprising the touch event on the surface of the second key of the plurality of depressible keys.

7. The keyboard of claim 5, wherein the plurality of depressible keys comprises at least one dual-purpose key operable to be depressed a first distance to a first level and a second distance to a second level, and wherein at least one switch sensor of the plurality of switch sensors is further operable to detect the at least one dual-purpose key being depressed the first distance to the first level and the at least one dual-purpose key being depressed the second distance to the second level.

8. The keyboard of claim 5, wherein the first command signal comprises information associated with the depression of the first key of the plurality of depressible keys or the touch event on the surface of the first key of the plurality of depressible keys, and wherein the second command signal comprises information associated with the depression of the second key of the plurality of depressible keys or the touch event on the surface of the second key of the plurality of depressible keys.

9. The keyboard of claim 5, wherein the keyboard is coupled to a computing device.

10. The keyboard of claim 5, wherein the keyboard is incorporated within a computing device.

11. A method for generating a keyboard command signal, the method comprising:
monitoring a plurality of depressible keys for a depression of a key of the plurality of depressible keys, wherein at least one key of the plurality of depressible keys is a multi-purpose key being monitored to detect the at least one multi-purpose key being depressed a first distance to a first level and the at least one multi-purpose key being depressed a second distance to a second level;
monitoring the plurality of depressible keys for a touch event on a surface of one or more of the plurality of depressible keys; and
generating a command signal based on the monitoring of the plurality of depressible keys for the depression of the key of the plurality of depressible keys and the monitoring of the plurality of depressible keys for the touch event on the surface of one or more of the plurality of depressible keys, wherein the command signal comprises a touch event command signal, the touch event command signal generated in response to a threshold length of time elapsing from detecting a touch event without detecting depression of the key.

12. The method of claim 11 further comprising:
receiving a first key depression signal in response to a detection of the at least one multi-purpose key being depressed the first distance to the first level; and
receiving a second key depression signal in response to a detection of the at least one multi-purpose key being depressed the second distance to the second level.

13. The method of claim 12, wherein the command signal comprises at least one of a first key depression command signal or a second key depression command signal, and wherein generating the command signal comprises:
generating the first key depression command signal in response to a threshold length of time elapsing from receiving the first key depression signal without receiving the second key depression signal; and
generating the second key depression command signal in response to receiving the second key depression signal within the threshold length of time from receiving the first key depression command signal.

14. The method of claim 13, wherein the at least one multi-purpose key is a spacebar key, and wherein the first key depression command signal causes generation of a space character, and wherein the second key depression command signal causes generation of a mouse click command.

15. The method of claim 11, wherein the touch event occurs at a key that is different than the depressed key.

16. A method for generating keyboard command signals, the method comprising:

receiving a first input, wherein the first input comprises one of a depression of a first key of a plurality of depressible keys or a touch event on a surface of the first key of the plurality of depressible keys;

receiving a second input, wherein the second input comprises one of a depression of a second key of the plurality of depressible keys or a touch event on a surface of the second key of the plurality of depressible keys;

determining whether the first input comprises the depression of the first key of the plurality of depressible keys or the touch event on the surface of the first key of the plurality of depressible keys, wherein determining whether the first input comprises a touch event comprises detecting a threshold length of time elapsing from detecting the touch event on the surface of the first key without detecting the depression of the first key;

determining whether the second input comprises the depression of the second key of the plurality of depressible keys or the touch event on the surface of the second key of the plurality of depressible keys, wherein determining whether the second input comprises a touch event comprises detecting the threshold length of time elapsing from detecting the touch event on the surface of the second key without detecting the depression of the second key;

generating a first command signal based on the determining whether the first input comprises the depression of the first key of the plurality of depressible keys or the touch event on the surface of the first key of the plurality of depressible keys; and generating a second command signal based on the determining whether the second input comprises the depression of the second key of the plurality of depressible keys or the touch event on the surface of the second key of the plurality of depressible keys.

17. The method of claim 16 further comprising:

generating a first key depression command signal in response to the first input comprising the depression of the first key of the plurality of depressible keys;

generating a first touch event command signal in response to the first input comprising the touch event on the surface of the first key of the plurality of depressible keys;

generating a second key depression command signal in response to the second input comprising the depression of the second key of the plurality of depressible keys; and generating a second touch event command signal in response to the second input comprising the touch event on the surface of the second key of the plurality of depressible keys.

18. The method of claim 17, wherein at least a portion of one of generating the first key depression command signal or generating the first touch event command signal occurs coextensive in time with one of generating the second key depression command signal or generating the second touch event command signal.

19. The method of claim 16, wherein the first input comprises the depression of the first key of the plurality of depressible keys, and wherein the second input comprises the depression of the second key of the plurality of depressible keys.

20. The method of claim 16, wherein the first input comprises the touch event on the surface of the first key of the plurality of depressible keys, and wherein the second input comprises the depression of the second key of the plurality of depressible keys.

21. The method of claim 16, wherein the first input comprises the depression of the first key of the plurality of depressible keys, and wherein the second input comprises the touch event on the surface of the second key of the plurality of depressible keys.

22. The method of claim 16, wherein the first input comprises the touch event on the surface of the first key of the plurality of depressible keys, and wherein the second input comprises the touch event on the surface of the second key of the plurality of depressible keys.

* * * * *